United States Patent
Knausz

(10) Patent No.: US 11,698,703 B2
(45) Date of Patent: Jul. 11, 2023

(54) INTEGRATED SYSTEM INCLUDING A SENSOR SWITCH AND A DISPLAY SWITCH ABOVE THE COMMON SUBSTRATE

(71) Applicant: IDEX Biometrics ASA, Oslo (NO)

(72) Inventor: Imre Knausz, Fairport, NY (US)

(73) Assignee: IDEX BIOMETRICS ASA, Oslo (NO)

( * ) Notice: Subject to any disclaimer, the term of this patent is extended or adjusted under 35 U.S.C. 154(b) by 0 days.

(21) Appl. No.: 17/370,852

(22) Filed: Jul. 8, 2021

(65) Prior Publication Data

US 2023/0008416 A1     Jan. 12, 2023

(51) Int. Cl.
*G06F 3/044* (2006.01)
*G06F 3/041* (2006.01)
*H10K 59/40* (2023.01)

(52) U.S. Cl.
CPC .......... *G06F 3/0447* (2019.05); *G06F 3/0412* (2013.01); *G06F 3/0445* (2019.05); *H10K 59/40* (2023.02)

(58) Field of Classification Search
CPC .... G06F 3/0447; G06F 3/0412; G06F 3/0445; H01L 27/323
See application file for complete search history.

(56) References Cited

U.S. PATENT DOCUMENTS

| | | | |
|---|---|---|---|
| 2015/0301382 A1 | 10/2015 | Ishitani et al. | |
| 2016/0343949 A1 | 11/2016 | Seo et al. | |
| 2017/0003824 A1 | 1/2017 | Yun et al. | |
| 2017/0024602 A1* | 1/2017 | Han | G06F 3/0446 |
| 2017/0038898 A1* | 2/2017 | Kim | G06F 3/0412 |
| 2017/0262095 A1* | 9/2017 | Reynolds | G06F 3/04166 |
| 2018/0130857 A1 | 5/2018 | Lee et al. | |
| 2019/0043927 A1* | 2/2019 | Jang | H01L 27/323 |
| 2021/0117035 A1* | 4/2021 | Kim | G06F 3/0416 |
| 2021/0132764 A1* | 5/2021 | Mayumi | G06F 3/044 |
| 2021/0149259 A1 | 5/2021 | Onaka et al. | |
| 2021/0165987 A1 | 6/2021 | Kim et al. | |
| 2022/0043528 A1* | 2/2022 | Kim | G06F 3/04186 |
| 2022/0179513 A1* | 6/2022 | Kim | H01L 27/3276 |
| 2022/0397971 A1* | 12/2022 | Yang | G06F 3/044 |

OTHER PUBLICATIONS

International Search Report and Written Opinion with Transmittal dated Nov. 8, 2022 in related International Application No. PCT/EP2022/068973 (15 pages).

* cited by examiner

*Primary Examiner* — Liliana Cerullo
(74) *Attorney, Agent, or Firm* — Rothwell, Figg, Ernst & Manbeck, P.C.

(57) ABSTRACT

System for display and presence detection are described. In some embodiments, a system may include a display and a sensor. The sensor may include a display switch, first and second display electrodes, and a light emission layer. The sensor may include a sensor switch, a sensor electrode, and an analog front end. The system may further include an external surface configured to transmit light emitted by the light emission layer toward a user.

6 Claims, 9 Drawing Sheets

INTEGRATED SYSTEM INCLUDING A SENSOR SWITCH AND A DISPLAY SWITCH ABOVE THE COMMON SUBSTRATE

FIELD OF THE DISCLOSURE

This disclosure relates to an integrated system of an electronic display and a sensor for detecting objects that touch or are located near the sensor.

BACKGROUND

A sensor may be used for detecting the presence of objects that touch or are located near the sensor. Such sensor can be configured to sense electrical characteristics of an object in order to sense presence or location of an object near or about the sensor, physical characteristics of the object, shapes, textures on surfaces of an object, material composition, biological information, and other features and characteristics of an object being sensed. For example, a sensor may be configured to detect the presence or position of a user's finger or other element, such as, in the exemplary case of a fingerprint sensor, one or more features (for example, ridges) of a user's finger.

In some cases, the sensor may be integrated with an electronic display by disposing the sensor on top of the electronic display. The electronic display may be a plasma display, a liquid crystal display (LCD), an electroluminescent (EL) display, an organic light emitting diode (OLED) display, a quantum dots display, or any display capable of generating a text or an image based on electrical signals applied to the display.

Technical limitations limit the widespread integration of certain types of sensors and electronic displays. For example, because a sensor is generally integrated with an electronic display by disposing the sensor on top of the electronic display, at least some components of the sensor may interfere with the user's viewing of the electronic display if such components of the sensor are not transparent. Additionally, it may be difficult to combine capacitive touch sensors with certain types of displays, as the display components may interfere with the capacitive sensing of the touch sensor.

Accordingly, there is a need for an integrated system that provides both sensor and display functionality, without sacrificing display quality or sensitivity of the sensor.

SUMMARY

The following presents a simplified summary in order to provide a basic understanding of some aspects described herein. This summary is not an extensive overview of the claimed subject matter. It is intended to neither identify key or critical elements of the claimed subject matter nor delineate the scope thereof. Its sole purpose is to present some concepts in a simplified form as a prelude to the more detailed description that is presented later.

In some embodiments, a system for display and detecting the presence of a user's finger or other element may be provided. The system may include a display, an external surface, and a sensor. In some embodiments, the display may include a display switch, first and second display electrodes, and a light emission layer. The light emission layer may be disposed between the first display electrode and the second display electrode, and the first display electrode and the second display electrode may be configured to apply a voltage to the light emission layer when the first switch is in a closed state. The external surface may be configured to transmit light emitted by the light emission layer toward a user. In some embodiments, the sensor may include a sensor switch, a sensor electrode, and an analog front end connected to the sensor electrode via the second switch. The sensor electrode may be configured, when the switch is in a closed state, to receive and provide to the analog front end a signal indicative of the presence of the user's finger or other element.

In some embodiments, one or more components of the sensor may be nontransparent. At least a portion of the first display electrode may define a light emission area, and a light emission path may be defined between the light emission area and the external surface. In some embodiments, at least 50% of the light emission path may be unobstructed by the nontransparent sensor components. In some embodiments, a method for detecting the presence of a user's finger or other element may be provided. For example, the method being performed using a system comprising a plurality of sensor electrodes. In some embodiments, the method may include detecting the presence of a user's finger using a first set of sensor electrodes. After detecting the presence of the user's finger using the first set of sensor electrodes, a fingerprint of the user's finger may be detected using a second set of sensor electrodes. In some embodiments, a density of electrodes per unit area of the sensor system of the second set of electrodes may be greater than the density of the first set of sensor electrodes.

Further variations encompassed within the systems and methods are described in the detailed description of the invention below.

BRIEF DESCRIPTION OF THE DRAWINGS

The accompanying drawings, which are incorporated herein and form part of the specification, illustrate various, non-limiting embodiments of the present invention. In the drawings, like reference numbers indicate identical or functionally similar elements.

DETAILED DESCRIPTION

Figure 1A:
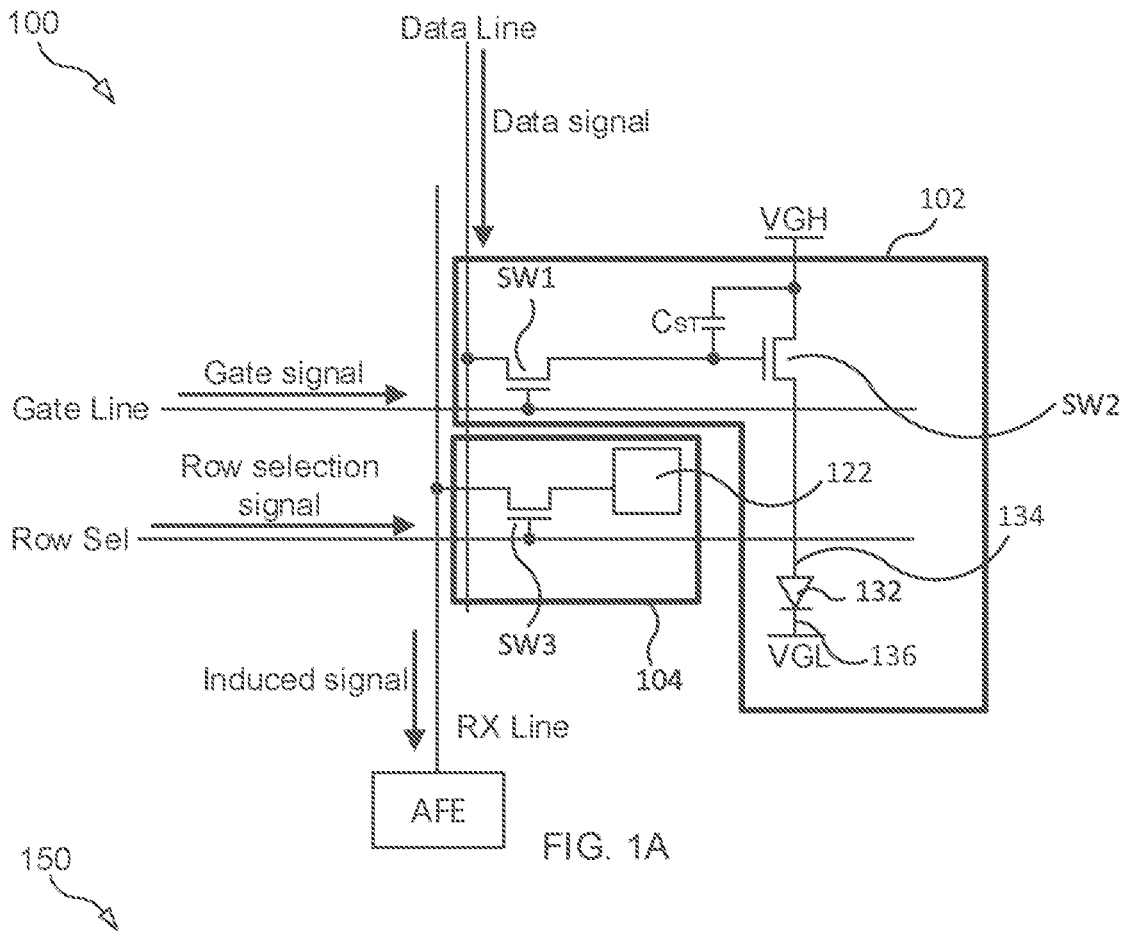
FIGS. 1A and 1B depict exemplary circuit diagrams of a display pixel and a sensor pixel.

While aspects of the subject matter of the present disclosure may be embodied in a variety of forms, the following description and accompanying drawings are merely intended to disclose some of these forms as specific examples of the subject matter. Accordingly, the subject matter of this disclosure is not intended to be limited to the forms or embodiments so described and illustrated.

Unless defined otherwise, all terms of art, notations and other technical terms or terminology used herein have the same meaning as is commonly understood by one of ordinary skill in the art to which this disclosure belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an exemplary implementation of a device embodying aspects of the disclosure and are not intended to be limiting.

As used herein, the terms "substantially" and "substantial" refer to a considerable degree or extent. When used in conjunction with, for example, an event, circumstance, characteristic, or property, the terms can refer to instances in which the event, circumstance, characteristic, or property occurs precisely as well as instances in which the event, circumstance, characteristic, or property occurs to a close approximation, such as accounting for typical tolerance levels or variability of the embodiments described herein.

As used herein, the terms "optional" and "optionally" mean that the subsequently described, component, structure, element, event, circumstance, characteristic, property, etc. may or may not be included or occur and that the description includes instances where the component, structure, element, event, circumstance, characteristic, property, etc. is included or occurs and instances in which it is not or does not.

The present disclosure may be incorporated using any suitable sensor, as will be understood by those of skill in the art. Such exemplary sensors may include touch screens, fingerprint sensors, or other sensors configured to detect the position of an object or feature thereof. For purposes of illustration, and not by way of limitation, the disclosure below discusses embodiments of two-dimensional sensors configured to detect the location of a user's finger or portion thereof. In some embodiments, exemplary sensors may include the general structure described in U.S. Pat. No. 8,421,890, which is incorporated herein by reference in its entirety.

Figure 1B:
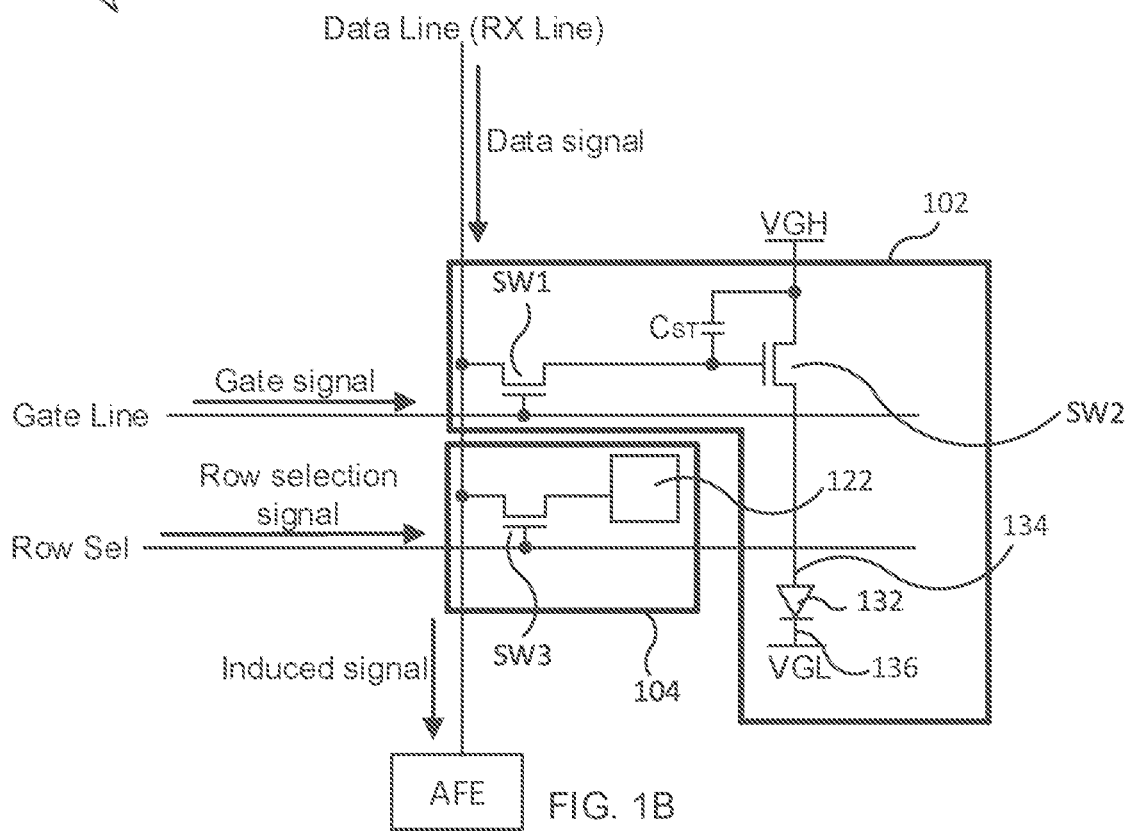

FIG. 1A and FIG. 1B depict exemplary circuit diagram for pairs 100, 150 of display pixels 102 and sensor pixels 104.

In some embodiments, the display pixel 102 may include a scan switch SW1, a drive switch SW2, a storage capacitor CST, and a light emitting element 132. The light emitting element 132 may be any element capable of emitting light based on electrical signal(s) applied to the element. In the exemplary pair 100 or 150 shown in FIGS. 1A and 1B, the light emitting element 132 is an organic light emitting diode (OLED).

In some embodiments, when a gate signal is applied to the gate of the scan switch SW1 via a gate line, the scan switch SW1 may be turned on. While the scan switch SW1 is on, a signal from a data line may be applied through the switch SW1 to the gate of the drive switch SW2. As a result, the drive switch SW2 may be turned on. While the drive switch SW2 is on, a drive signal VGH applied to the source/drain of the drive switch SW2 may be delivered to an anode 134 of the light emitting element 132. While the drive signal VGH is applied to the anode 134, a voltage corresponding to a difference between a potential at the anode 134 and a potential at a cathode 136 of the light emitting element 132 may be generated, and as a result, the light emitting element 132 may emit light.

The sensor pixel 104 may include a sensor switch SW3 and a sensor electrode 122. An exemplary operation of the sensor pixel 104 is described below.

In some embodiments, when an object is near or touches the sensor electrode 122, due to a capacitance coupling between the object and the sensor electrode 122, a signal may be induced. The induced signal may be applied to the source/drain of the sensor switch SW3. When a row selection signal is applied to the gate of the sensor switch SW3, the sensor switch SW3 may be turned on, and the induced signal may be delivered to an analog front end (AFE) through a receive (RX) line (in the pair 100) or the data line (in the pair 150).

In some embodiments, at least a part of the displaying operation of the display pixel 102 and at least a part of the sensing operation of the sensor pixel 104 may be performed simultaneously. In other embodiments, the displaying operation of the display pixel 102 and the sensing operation of the sensor pixel 104 may be performed sequentially.

Although FIGS. 1A and 1B show that the transmission direction of the induced signal is downward (i.e., the transmission direction of the induced signal is parallel to the transmission direction of the data signal), the transmission direction of the induced signal may be any direction depending on the location of the sensing circuit. For example, if the sensing circuit is located above the sensor pixel 104, the transmission direction of the induced signal may be upward (i.e., the transmission direction of the induced signal is opposite to the transmission direction of the data signal).

Each of the switches SW1, SW2, and SW3 may be any electrical component capable of changing a conductive state of the component based on electrical signal(s) applied to the component. For example, each of the switches SW1, SW2, and SW3 may be a metal-oxide-semiconductor field-effect transistor (MOSFET) such as a thin-film transistor (TFT).

The arrangement of the display pixel 102 and the sensor pixel 104 shown in FIGS. 1A and 1B is provided just for illustration purpose and does not limit the embodiments of this disclosure in any way.

Figure 2:
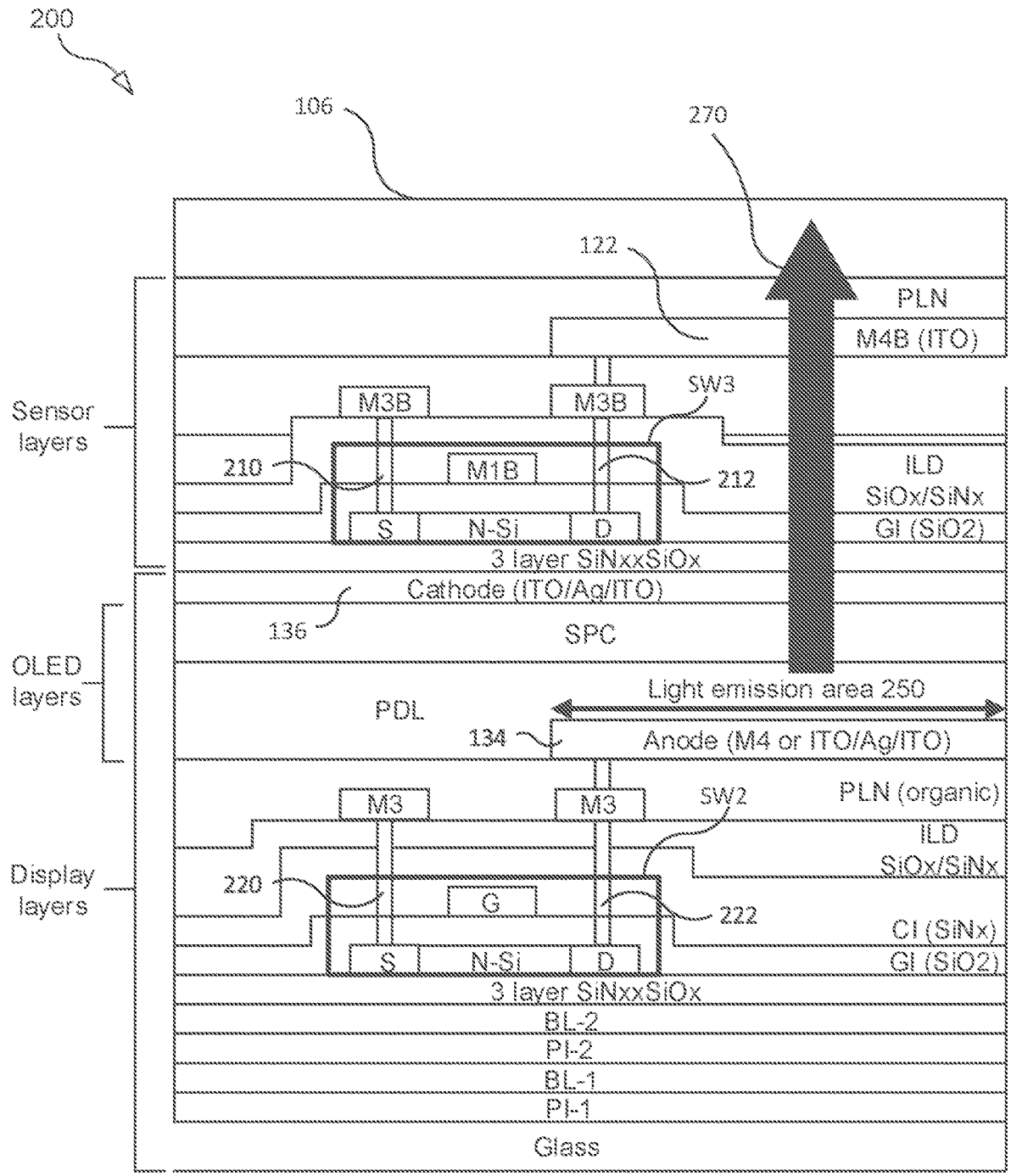
FIG. 2 depicts a side view of a portion of an exemplary system.

FIG. 2 shows a side view of a portion of an exemplary system 200 according to some embodiments. The system 200 may include a display including a plurality of display pixels and a sensor including a plurality of sensor pixels. The display and the sensor may be formed together in an integrated manner (rather than forming them separately first and then combining them later). In some embodiments, the plurality of display pixels may include one or more display pixels 102 shown in FIGS. 1A and 1B. In some embodiments, the plurality of sensor pixels may include one or more sensor pixels 104 shown in FIGS. 1A and 1B. In some embodiments, any of the systems disclosed herein may include a plurality of display pixels 102 and sensor pixels 104 arranged in a two-dimensional grid. In some embodiments, the plurality of display pixels 102 may be configured to display an image. In some embodiments, the plurality of sensor pixels may be configured to detect the presence or location of an object, such as a user's finger or structures thereof (e.g., ridges and valleys of a finger for biometric identification). In some embodiments, the two-dimensional grid of display and sensor pixels may form a touch screen configured to display images and detect the presence and/or location of an object such as, for example, a user's finger or structures thereof. In some embodiments, the number of the display pixels included in the system 200 and the number of sensor pixels included in the system 200 may be the same. In other embodiments, the number of the display pixels included in the system 200 may be greater than or less than the number of sensor pixels included in the system 200.

Referring to FIG. 2, the sensor switch SW3 may include a source (S), a drain (D), and a gate (G). In some embodiments, the sensor electrode 122 may be electrically connected to the drain (D) of the sensor switch SW3 using a conductive structure 212. The source (S) of the sensor switch SW3 may be electrically connected to the RX line or the data line (not shown in FIG. 2) using a conductive structure 210. Even though FIG. 2 shows that the drain (D) of the sensor switch SW3 is electrically connected to the sensor electrode 122, the source (S) of the sensor switch SW3 (instead of the drain (D)) may be electrically connected to the sensor electrode 122. Similarly, even though FIG. 2 shows that the source (D) of the sensor switch SW3 is electrically connected to the RX line or the data line, the drain (S) of the sensor switch SW3 (instead of the source (S)) may be electrically connected to the RX line or the data line. In some embodiments, signals transmitted through the RX line may be received by an analog front end (AFE).

The sensor electrode 122 may be made of any transparent material. For example, the sensor electrode 122 may be formed of one or a combination of an indium tin oxide (ITO) or silver (Ag). In this disclosure, a "transparent" material means any material having a transmittance that is greater than or equal to 50%. Similarly, a "non-transparent" material means any material having a transmittance that is less than 50%.

The system 200 may further includes a display pixel 102 that includes one or more of a scan switch SW1, a drive switch SW2, a storage capacitor CST, and a light emitting element 132. In some embodiments, the light emitting element may include an anode 134 and a cathode 136.

In the system 200, drive switch SW2 may be a TFT that includes a source (S), a drain (D), and a gate (G). As shown in FIG. 2, the anode 134 is disposed above the drive switch SW2 and is electrically connected to the drain (D) of the drive switch SW2 using a conductive structure 222. The source (S) of the drive switch SW2 is electrically connected to a source of the drive signal VGH (not shown in FIG. 2) using a conductive structure 220. Even though FIG. 2 shows that the drain (D) of the drive switch SW2 is electrically connected to the anode 134, the source (S) of the drive switch SW2 (instead of the drain (D)) may be electrically connected to the anode 134. Similarly, even though FIG. 2 shows that the source (D) of the drive switch SW2 is electrically connected to the source of the drive signal VGH (not shown in FIG. 2), the drain (D) of the drive switch SW2 (instead of the source (S)) may be electrically connected to the source of the drive signal VGH.

The anode 134 may be made of any transparent material. For example, the anode 134 may be formed of one or a combination of an indium tin oxide (ITO) or silver (Ag).

In some embodiments, the anode 134 defines a light emission area 250 from which light is emitted. When the drive signal VGH is supplied to the anode 134, a voltage corresponding to a difference between a potential at the anode 134 and a potential at the cathode 136 may excite OLED layers. As a result, the OLED layers may emit light that travels through a light emission path 270 defined as a space having boundaries that are normal to the light emission area 250 and disposed between the light emission area 250 and an external surface 106 of the system which is configured to transmit light emitted by the light emission layer toward a user. Depending on the configuration of the systems described herein, the external surface may be located above or below the OLED layers (e.g., the systems may be top-emitting or bottom-emitting).

In some embodiments, it may be desirable to form the conductive structures 210 and 212 from one or more non-transparent material(s). In such cases, the conductive structures 210 and 212 should be arranged such that they are not disposed, or are minimally disposed, in the light emission path 270, so that interference with the transmission of light emitted from the OLED layers is minimized.

Therefore, according to some embodiments, conductive structure 210 may be disposed outside of the light emission path 270. In some embodiments, conductive structure 212 may be disposed outside of the light emission path. In other embodiments, conductive structure 212 may be disposed within the light emission path 270 but such that it is vertically aligned with a non-emissive OLED structure (e.g., the non-transparent conductive structure 222). By disposing conductive structures 210, 212 outside of the light emission path 270, interference with the transmission of the light emitted from the OLED layers is minimized. Likewise, in embodiments in which conductive structure 212 is disposed within the light emission path 270, vertically aligning the conductive structure 212 with a non-emissive OLED structure 222 may reduce the interference contributed by structure 212.

In some embodiments, the sensor electrode 122 may be disposed in or partially disposed the light emission path 270. For example, at least 50% of the sensor electrode may be disposed within the light emission path. In embodiments in which the sensor electrode 122 is made of a transparent material, the sensor electrode 122's interference with the light emitted from the OLED layers may be minimized. In other embodiments, the sensor electrode 122 may be located outside of the light emission path 270. In such embodiments, the sensor electrode 122 may optionally be non-transparent.

In some embodiments, the light emission path 270 defined between the light emission area 250 and the external surface 106 may be substantially unobstructed by nontransparent components. For example, in embodiments where all non-transparent components are positioned outside of the light emission path 270, the light emission path may be considered to be 100% unobstructed by nontransparent components. In other embodiments, a percentage of the light emission path which is unobstructed by nontransparent components may be measured by comparing a cross-sectional area of the light emission path which is not obstructed by nontransparent components and comparing that cross-sectional area to the light emission area 250. In some embodiments, the light emission path 270 may be 99%, 97%, 95%, or 90% unobstructed by nontransparent components. In other embodiments, the light emission path 270 may be 80%, 70%, 60%, or 50% unobstructed by nontransparent components.

Figure 3:
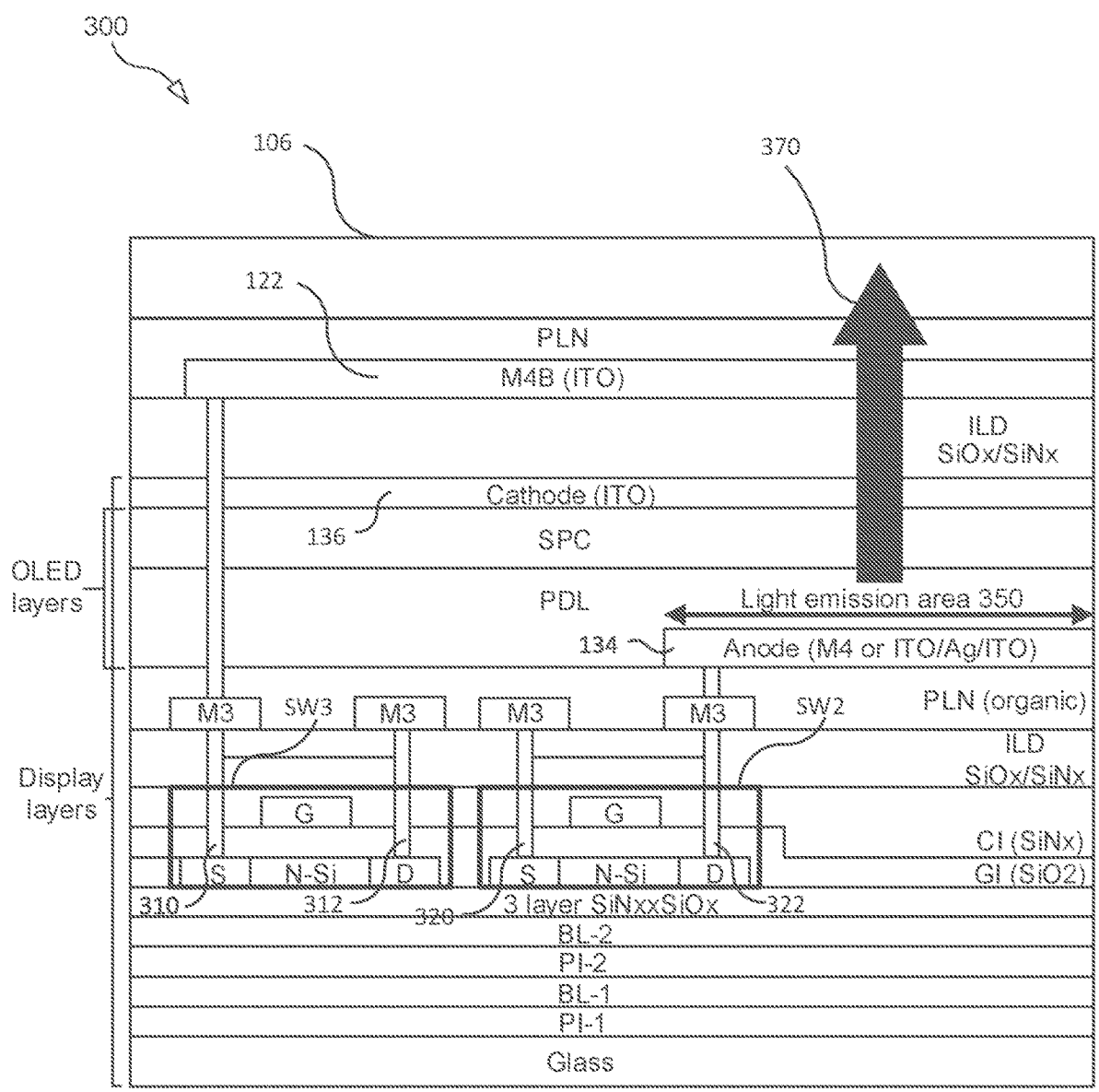
FIG. 3 depicts a side view of a portion of an exemplary system.

FIG. 3 shows a side view of a portion of an exemplary system 300 according to some embodiments. In some embodiments, system 300 may include a display including a plurality of display pixels and a sensor including a plurality of sensor pixels. The display and the sensor may be formed together in an integrated manner (rather than forming them separately and adding them later). The plurality of display pixels may include a display pixel 102, such as that shown in FIGS. 1A and 1B. The plurality of sensor pixels may include a sensor pixel 104, such as that shown in FIGS. 1A and 1B. In some embodiments, the number of the display pixels included in the system 300 and the number of sensor pixels included in the system 300 may be the same. In other embodiments, the number of the display pixels included in the system 300 may be greater than the number of sensor pixels included in the system 300.

As discussed above with respect to FIGS. 1A and 1B, in some embodiments, the sensor pixel 104 illustrated in FIG. 3 may include a sensor switch SW3 and a sensor electrode 122. In some embodiments, a display pixel 102 may include a scan switch SW1, a drive switch SW2, a storage capacitor CST, and a light emitting element 132. In some embodiments, the light emitting element 132 may include an anode 134 and a cathode 136.

In some embodiments, the anode 134 of system 300 may define a light emission area 350 from which light may be emitted. When the drive signal VGH is applied to the anode 134, a voltage corresponding to a difference between a potential at the anode 134 and a potential at the cathode 136 may excite OLED layers and, as a result, the OLED layers may emit light. In some embodiments, the emitted light may travel through a light emission path 370.

In some embodiments, the sensor switch SW3 of system 300 may be disposed within one or more layers located below the anode 134. For example, the source (S) and the drain (D) of the sensor switch SW3 may be disposed in the same layer as the source (S) and the drain (D) of the drive switch SW2, and the gate (G) of the sensor switch SW3 may be disposed in the same layer as the gate (G) of the drive switch SW2.

Disposing the sensor switch SW3 within one or more layers below the anode 134 additionally allows conductive structures 310 and 312 to be disposed below the anode 134, such that switch SW3 and structures 310, 312 are not disposed within light emission path 370 and do not interfere with the transmission of the light from the light emission area 350. Similarly to system 200, the sensor electrode 122 of system 300 may be made from a transparent material, such that the sensor electrode 122 may be disposed within the light emission path 370 without substantially interfering with the light emitted from the OLED layers. As illustrated in FIG. 3, the sensor electrode 122 may be disposed between the OLED layers and the external surface 106, and the OLED layers may be disposed between the sensor electrode 122 and the switch SW3. In such cases, the sensor electrode 122 may be electrically connected to switch SW3 through an opening in the OLED layers. In some embodiments, switches SW2 and SW3 may be deposited on a common substrate.

Similar to the FIG. 2 embodiment, light emission path 370 may be defined between light emission area 350 and an external surface 106 of the system which is configured to transmit light emitted by the light emission layer toward a user. In some embodiments, the light emission path 370 may be substantially unobstructed by nontransparent components. For example, in embodiments where all nontransparent components are positioned outside of the light emission path 370, the light emission path may be considered to be 100% unobstructed by nontransparent components. In other embodiments, a percentage of the light emission path which is unobstructed by nontransparent components may be measured by comparing a cross-sectional area of the light emission path which is not obstructed by nontransparent components and comparing that cross-sectional area to the light emission area 350. In some embodiments, the light emission path 370 may be 99%, 97%, 95%, or 90% unobstructed by nontransparent components. In other embodiments, the light emission path 370 may be 80%, 70%, 60%, or 50% unobstructed by nontransparent components.

Figure 4:
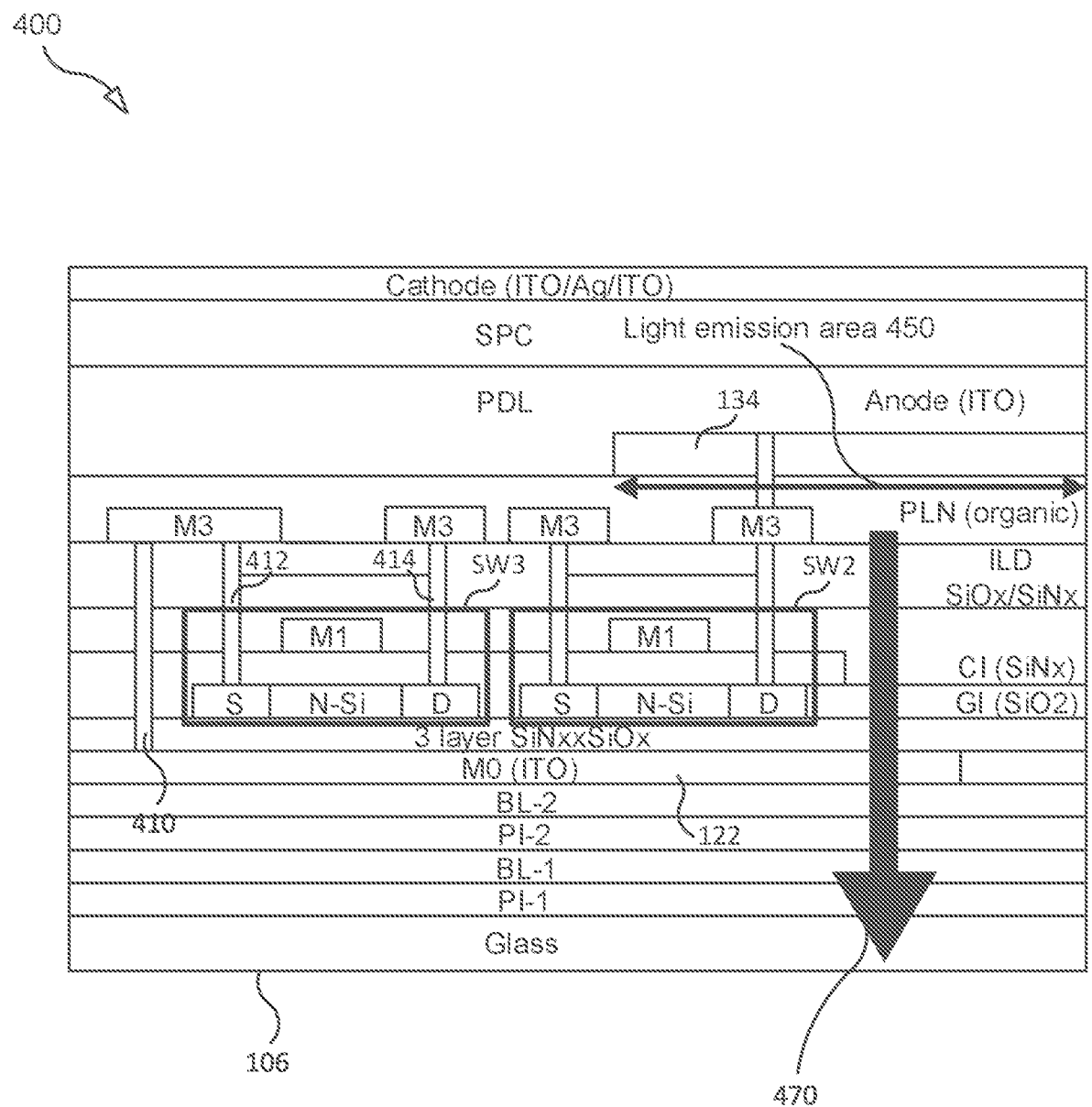
FIG. 4 depicts a side view of a portion of an exemplary system.

FIG. 4 shows a side view of a portion of an exemplary system 400 according to some embodiments. Like system 200 and system 300, the system 400 may include a display including a plurality of display pixels and a sensor including a plurality of sensor pixels. The display and the sensor may be formed together in an integrated manner (rather than, for example, forming them the two structures separately and then combining them together). In some embodiments, the plurality of display pixels may include a display pixel 102 shown in FIGS. 1A and 1B. The plurality of sensor pixels may include a sensor pixel 104 shown in FIGS. 1A and 1B. In some embodiments, the number of the display pixels included in the system 400 and the number of sensor pixels included in the system 400 may be the same. In other embodiments, the number of the display pixels included in the system 400 may be greater than the number of sensor pixels included in the system 400.

Like the embodiments discussed above, sensor pixel 104 of system 400 may include a sensor switch SW3 and a sensor electrode 122. Display pixel 102 may include a scan switch SW1, a drive switch SW2, a storage capacitor CST, and a light emitting element 132. In some embodiments, the light emitting element may include an anode 134 and the cathode 136. In some embodiments, anode 134 may define a light emission area 450 from which light is emitted. When the drive signal VGH is supplied to the anode 134, a voltage corresponding to a difference between a potential at the anode 134 and a potential at the cathode 136 may excite OLED layers and, as a result, the OLED layers emit may light which may travel through a light emission path 470. In some embodiments, switches SW2 and SW3 may be disposed between anode 134 and sensor electrode 122. Switches SW2 and SW3 may also be disposed between the OLED layers and an external surface 106 of the system.

FIG. 4 shows an exemplary embodiment of a bottom-emission type system 400. As illustrated in FIG. 4, system 400 may be arranged to emit light toward the bottom of the system 400 (as the direction of the light transmission path 470 indicates).

In some embodiments, sensor switch SW3 and conductive structures 412 and 414 may be disposed at a side of the anode 134 to which the light from the anode 134 is transmitted. Because the switch SW3 and conductive structures 412 and 414 are disposed outside of the light emission area 450, they do not interfere with the transmission of the light from the light emission area 450.

In some embodiments, the sensor electrode 122 may be transparent. Accordingly, the sensor electrode 122 may be disposed at least partially within the light emission path 470, the sensor electrode 122's interference with the light emitted from the OLED layers may be minimized.

Light emission path 470 may be defined between light emission area 450 and an external surface 106 of the system which is configured to transmit light emitted by the light emission layer toward a user. In some embodiments, the light emission path 470 may be substantially unobstructed by nontransparent components. For example, in embodiments where all nontransparent components are positioned outside of the light emission path 470, the light emission path may be considered to be 100% unobstructed by nontransparent components. In other embodiments, a percentage of the light emission path which is unobstructed by nontransparent components may be measured by comparing a cross-sectional area of the light emission path which is not obstructed by nontransparent components and comparing that cross-sectional area to the light emission area 450. In some embodiments, the light emission path 470 may be 99%, 97%, 95%, or 90% unobstructed by nontransparent components. In other embodiments, the light emission path 470 may be 80%, 70%, 60%, or 50% unobstructed by nontransparent components.

Figure 5A:
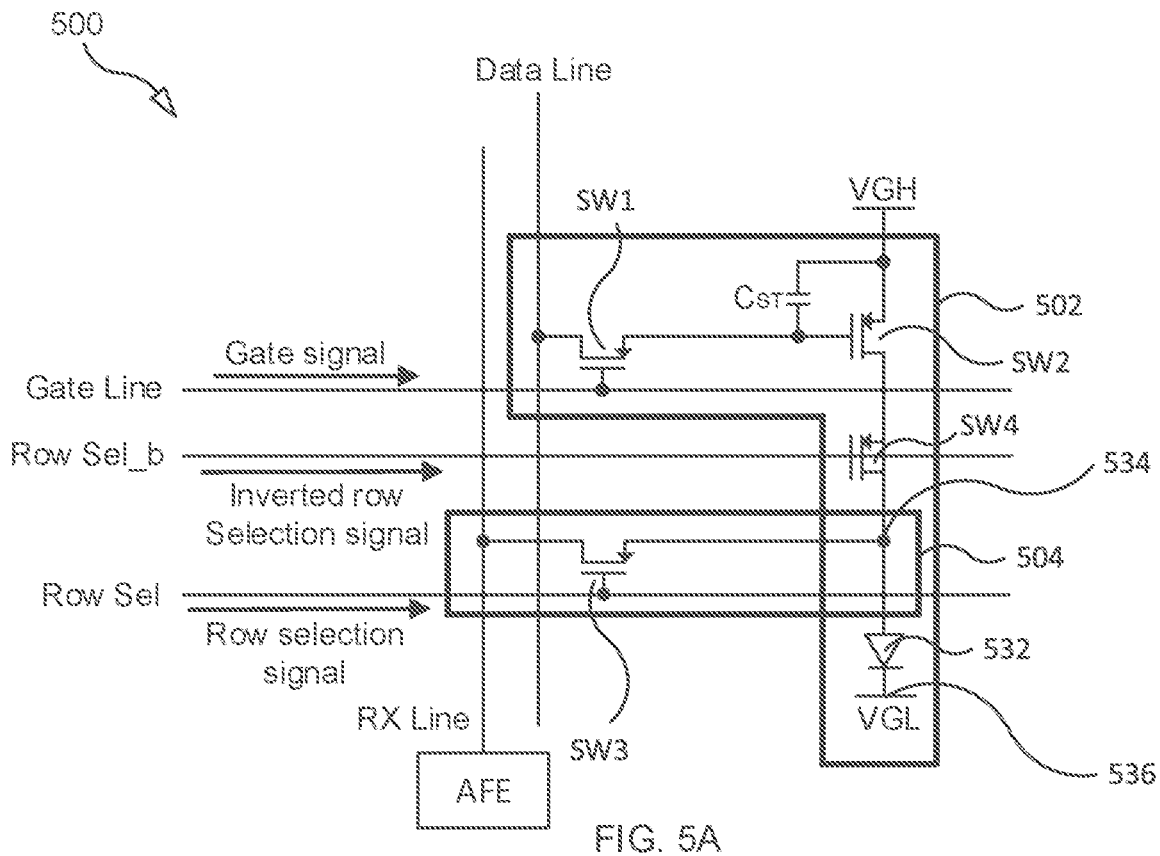
FIGS. 5A and 5B depict exemplary circuit diagrams of a display pixel and a sensor pixel.
Figure 5B:
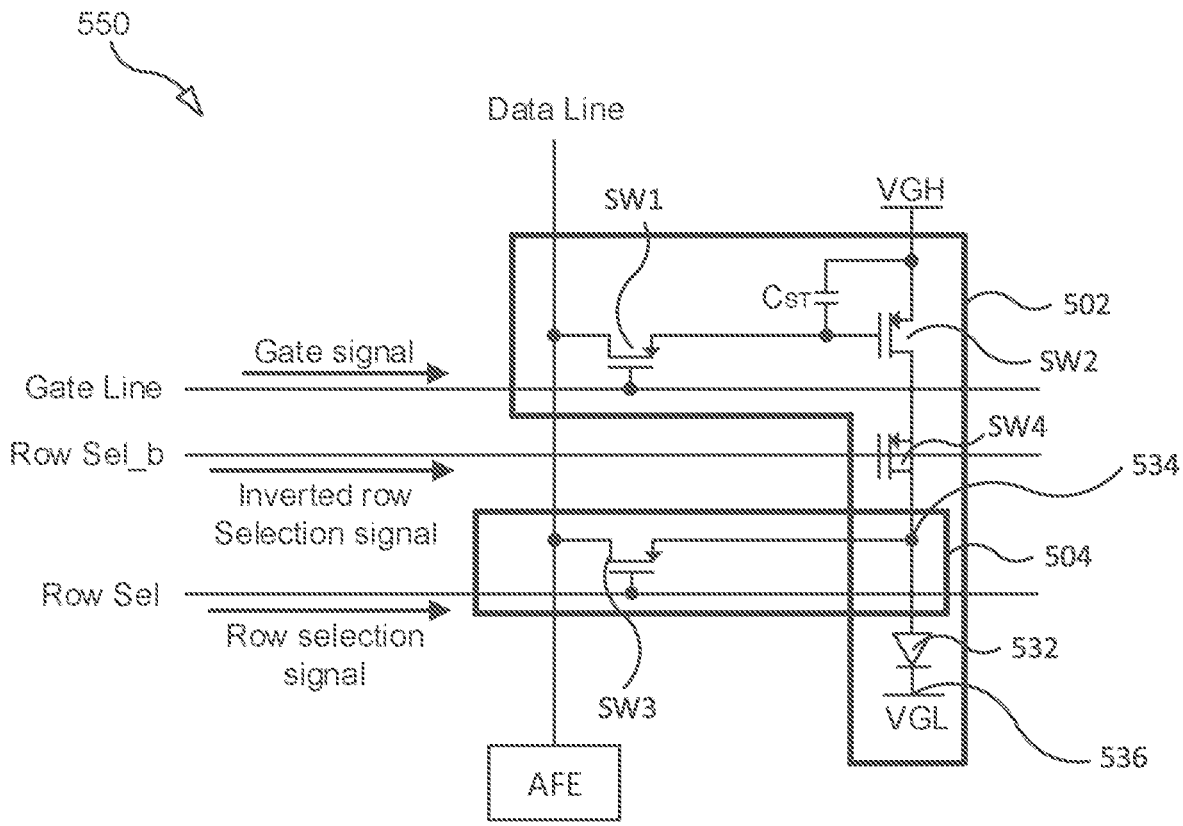

FIGS. 5A and 5B depict exemplary circuit diagrams for exemplary systems 500, 550 including a display pixel 502 and a sensor pixel 504 according to some embodiments.

In some embodiments, a display pixel 502 may include one, some, or all of a scan switch SW1, a drive switch SW2, a selection switch SW4, storage capacitor CST, and a light emitting element 532. In some embodiments, the light emitting element 532 may be any element capable of emitting light based on electrical signals applied to the element. For example, the light emitting element 532 may be an organic light emitting diode (OLED).

An exemplary operation of the display pixel 502 is described below. In some embodiments, when a scan signal is applied to the gate of the scan switch SW1 via a gate line, scan switch SW1 may be turned on. While the scan switch SW1 is on, a signal from a data line may be applied through the switch SW1 to the gate of the drive switch SW2. As a result, the drive switch SW2 may be selectively turned on. While the drive switch SW2 is on, a drive signal VGH applied to the source/drain of the drive switch SW2 may be delivered to the source/drain of the selection switch SW4. When an inverted row selection (which may be inverted relative to a row selection signal described below) signal is applied to the gate of the selection switch SW4, the selection switch SW4 may be turned on, and thus the drive signal applied to the source/drain of the selection switch SW4 may be delivered to the anode 534 of the light emitting element 532. The drive signal applied to the anode 534 may apply a voltage corresponding to a difference between a potential at the anode 534 and a potential at a cathode 636. As a result, the light emitting element 532 may emit light.

In some embodiments, a sensor pixel 504 may include a sensor switch SW3 and the anode 534. An exemplary operation of the sensor pixel 504 is described below.

When an object is near or touches the anode 534, due to a capacitance coupling between the object and the anode 534, a signal may be induced and the induced signal may be applied to the source/drain of the sensor switch SW3. When a row selection signal is applied to the gate of the sensor switch SW3, the sensor switch SW3 may be turned on, and thus the induced signal applied to the source/drain of the sensor switch SW3 may be delivered to a sensing circuit (not shown) through a receive (RX) line (in the system 500 of FIG. 5A) or the data line (in the system 550 of FIG. 5B).

In some embodiments, the electrode 534 may thus be selectively used in a first state as an anode 534 of the light emitting element 532 and in a second state as a sensor electrode 534 for detecting a capacitive coupling between an object and the sensor pixel 504. In some embodiments, the state of the electrode 534 may be selectively controlled via the row selection signal and inverted row selection signal illustrated in FIGS. 5A and 5B. In some embodiments, the row selection signal and inverted row selection signal may be inverted relative to one-another, such that when switch SW3 is on, switch SW4 is off, and vice-versa.

Thus, in systems 500, 550, when a row selection signal is applied to gate of the sensor switch SW3 to turn on the sensor switch SW3, an inverted row selection signal may be applied to the gate of the selection switch SW4 such that the selection switch SW4 is turned off to prevent the delivery of the drive signal VGH to the electrode 534. Similarly, when an inverted row selection signal is applied to the gate of the selection switch SW4 to turn on the selection switch SW4, a row selection signal may be applied to the gate of the sensor switch SW3 to turn off the sensor switch SW3, and thus to prevent the drive signal VGH applied to the anode 634 from being delivered via the RX line (FIG. 5A) or data line (FIG. 5B) to a sensing circuit. In some embodiments, signals transmitted through the RX line may be received by an analog front end (AFE).

In some embodiments, the electrode 534 may not be used as an electrode for the light emission element 532 and as a sensor electrode for the sensor pixel 504 simultaneously. In these embodiments, the displaying operation of the display pixel and the sensing operation of the sensor pixel may not be performed at the same time.

Each of the switches SW1, SW2, SW3, and SW4 may be any electrical component capable of changing a conductive state of the component based on electrical signal(s) applied to the component. For example, each of the switches SW1, SW2, SW3, and SW4 may be a metal-oxide-semiconductor field-effect transistor (MOSFET) such as a thin-film transistor (TFT).

Figure 6:
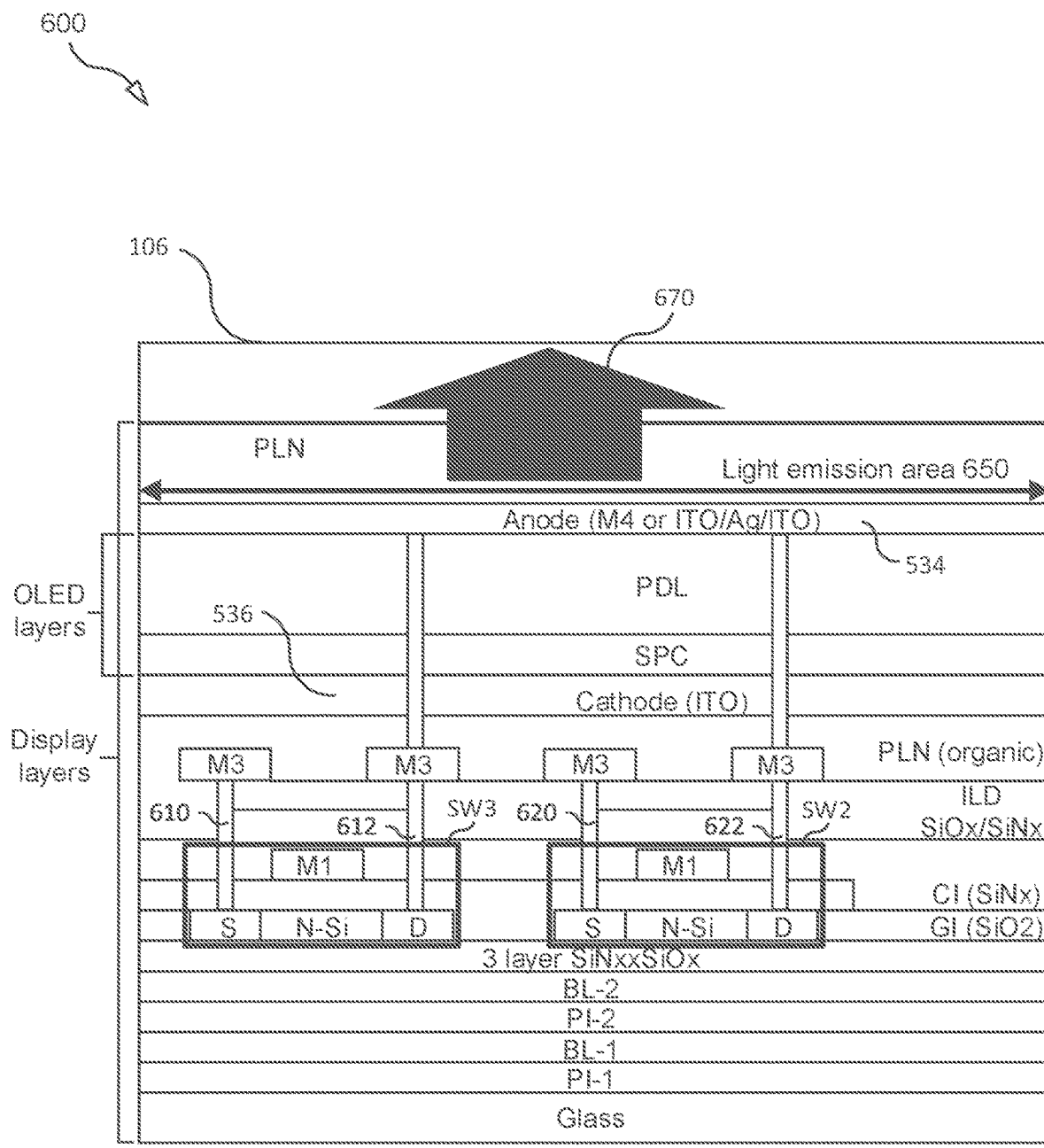
FIG. 6 depicts a side view of a portion of an exemplary system.

FIG. 6 shows a side view of a portion of an exemplary system 600 according to some embodiments. In some embodiments, the system 600 may include a display including a plurality of display pixels and a sensor including a plurality of sensor pixels. In some embodiments, the display and the sensor may be formed together in an integrated manner (rather than forming them separately and combining them later). The plurality of display pixels may include one or more display pixels 502 and sensor pixels 504 such as those illustrated FIGS. 5A and 5B. In some embodiments, the plurality of display pixels and sensor pixels arranged in a two-dimensional grid. In some embodiments, the plurality of display pixels may be configured to display an image. In some embodiments, the plurality of sensor pixels may be configured to detect the presence or location of an object, such as a user's finger or structures thereof (e.g., ridges and valleys of a finger for biometric identification). In some embodiments, the two-dimensional grid of display and sensor pixels may form a touch screen configured to display images and detect the presence and/or location of an object such as, for example, a user's finger or structures thereof. In some embodiments, the number of the display pixels included in the system 600 and the number of sensor pixels included in the system 600 may be the same. In other embodiments, the number of the display pixels included in the system 600 may be greater than the number of sensor pixels included in the system 600. In other embodiments, the number of the display pixels included in the system 600 may be less than the number of sensor pixels included in the system 600.

As discussed with respect to FIGS. 5A and 5B, a sensor pixel 504 may include a sensor switch SW3 and an anode 534. In some embodiments, the sensor switch SW3 may be disposed in one or more layers of the system.

In some embodiments, switch SW3 may include a source (S), a drain (D), and a gate (G). As shown in FIG. 6, anode 534 may be electrically connected to the drain (D) of the sensor switch SW3 using a conductive structure 612. In some embodiments, anode 534 may be transparent. For example, the anode 534 may be formed of one or a combination of an indium tin oxide (ITO) or silver (Ag). In some embodiments, switch SW3 may be electrically connected to an RX line, such as that illustrated FIG. 5A. In some embodiments, switch SW3 may be electrically connected to a data line, such as that illustrated in FIG. 5B. In some embodiments, the connection between switch SW3 and an RX line or data line may be made using a conductive structure 610.

In some embodiments, a display pixel 502 may include one, some, or all of a scan switch SW1, a drive switch SW2, a selection switch SW4, a capacitor CST, and a light emitting element 532. In some embodiments, light emitting element 532 may include an anode 534 and a cathode 536, as illustrated in FIG. 6.

In some embodiments, switch SW2 may include a source (S), a drain (D), and a gate (G). In some embodiments, anode 534 may be disposed above the switch SW2 and may be electrically connected to switch SW2 using a conductive structure 622. In some embodiments, switch SW2 may be electrically connected to receive a drive signal VGH using a conductive structure 620. It is noted that the orientation of the source (S) and drain (D) in any of the embodiments discussed herein may be reversed without departing from the scope of this disclosure.

In some embodiments, using a common electrode 534 to function as an anode in the display system and a sensor electrode in a sensor system, it may be possible to position one, some, or all of the circuit components on a single side of the electrode 534. In this manner, a light emission path may be disposed on an opposite side of the electrode 534 such that none of the circuit components are disposed within the light emission path. In some embodiments, the OLED layers may be disposed between the common electrode 534 and the switches SW2, SW3. In some embodiments, the common electrode 534 may be electrically to one or both of switches SW2, SW3 through respective openings in the OLED layers.

In some embodiments, one, some, or all of the circuit components in system 600 (including, for example, switches SW2, SW3, SW4 and conductive structures 610, 612, 620, 622 may be non-transparent without interfering with a light emission path 670. In some embodiments, the electrode 534 may be transparent such that light generated by the OLED layers may pass through the electrode 534 without substantial interference.

Light emission path 670 may be defined between light emission area 650 and an external surface 106 of the system which is configured to transmit light emitted by the light emission layer toward a user. In some embodiments, the light emission path 670 may be substantially unobstructed by nontransparent components. For example, in embodiments where all nontransparent components are positioned outside of the light emission path 670, the light emission path may be considered to be 100% unobstructed by nontransparent components. In other embodiments, a percentage of the light emission path which is unobstructed by nontransparent components may be measured by comparing a cross-sectional area of the light emission path which is not obstructed by nontransparent components and comparing that cross-sectional area to the light emission area 650. In some embodiments, the light emission path 670 may be 99%, 97%, 95%, or 90% unobstructed by nontransparent components. In other embodiments, the light emission path 670 may be 80%, 70%, 60%, or 50% unobstructed by nontransparent components.

Figure 7:
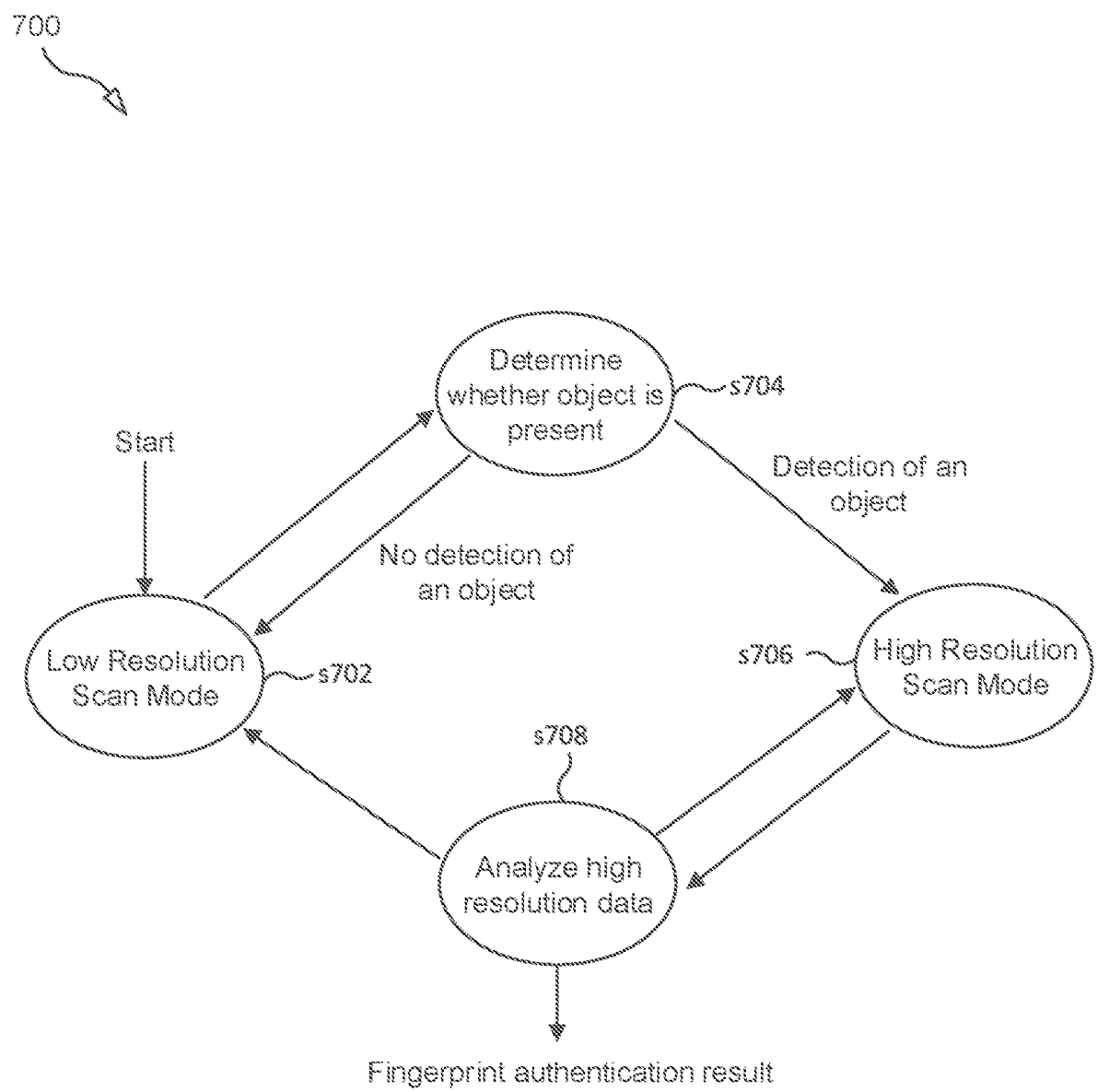
FIG. 7 illustrates an exemplary method of operating a system.

FIG. 7 shows an exemplary method 700 which may be used in combination with any of the systems disclosed herein. As discussed above, a system may include (i) a display including a plurality of display pixels and (ii) a sensor including a plurality of sensor pixels each of which is configured to generate a signal when an object is near or touches each sensor pixel.

The method 700 may begin with step s702. In the step s702, the system may initially operate in a low-resolution scan mode. For example, one or more sensor pixels included in the system may be configured such that the one or more sensor pixels are ready to generate sensor signals when an object is near or touches said one or more sensor pixels.

Figure 8A:
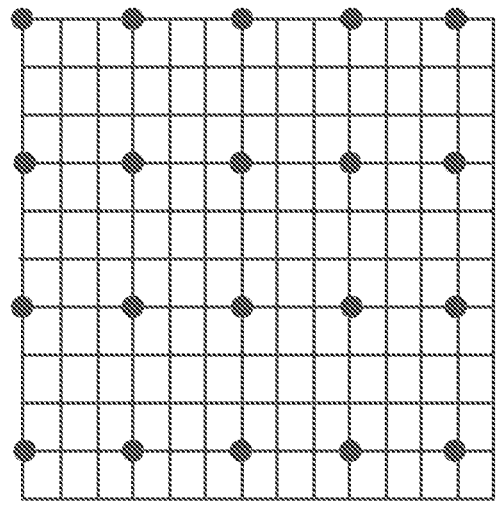
FIGS. 8A and 8B illustrate a configuration of sensor pixels used in exemplary low-resolution scan modes.
Figure 8B:
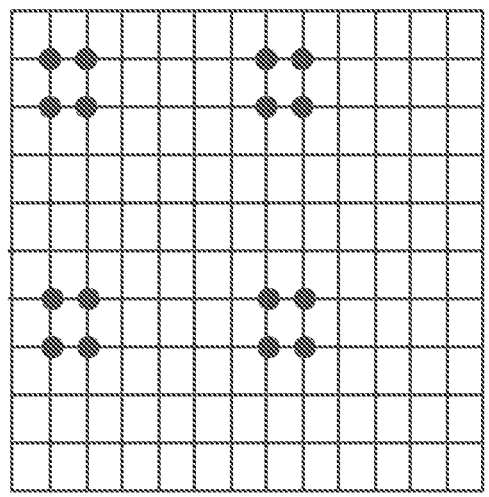

In the low-resolution scan mode, only a portion of all sensor pixels included in the system may be configured to generate sensor signals. The arrangement of the sensor pixels used in the low-resolution scan mode may be selected to provide adequate coverage such that the system can reliably determine when to entire a high-resolution scan mode and in which area of a system a high-resolution scan should be performed. At the same time, the arrangement of the sensor pixels used in the low-resolution scan mode may also be selected to minimize the number of pixels that are in a sensing state at any given time. Minimizing the number of sensor pixels used in a low-resolution scan mode may be particularly advantageous in systems where pixels may be alternatively used for display and sensing, but in which any given pixel cannot operate in display and sensing states simultaneously. In such systems, minimizing the number of pixels in a sensing state may thus maximize the number of pixels in a display state, thereby improving the quality of a displayed image. FIGS. 8A and 8B show exemplary arrangements of sensor pixels which may be used for scanning in an exemplary low-resolution scan mode.

For example, sensing pixels may be evenly distributed across a sensor matrix shown in FIG. 8A. In the illustrated embodiment, every three sensor pixels in a horizontal direction and in a vertical direction are used for scanning. However, the spacing between sensor pixels may be selected based on the needs of a given application. For example, sensor pixels may be distributed every two, five, ten, twenty, etc. pixels. In another example, in the exemplary low-resolution scan mode shown in FIG. 8B, sensor-mode pixels may be clustered together. In the illustrated embodiment of FIG. 8B, groups of sensor pixels may be arranged in a 2×2 clusters with non-sensing pixels between the clusters. Again, any suitable size of clusters and spacing between clusters may be used, as determined by the needs of a given application. For example, clusters of 3×3, 4×4, 5×5, 2×3, 2×4, 2×5, 3×4, 3×5, 4×5, etc. may be used. Likewise, the clusters may be separated by gaps of 3, 5, 10, 20, etc. pixels.

Further, in embodiments where pixels can be selectively placed in sensing and non-sensing (e.g., display) states, the sensing pixels used in a low-resolution scan mode need not be fixed. For example, in a first timeslot, a first selection of pixels may be placed in a sensing state, and in a second timeslot, a second selection of pixels different from the first selection of pixels may be placed in a sensing state. Third, fourth, fifth, etc. selections may be used as desired. In this manner, pixels may be placed in sensing state in alteration to ensure adequate coverage of the display area as the area of the sensor grid is cycled through in a low-resolution scan mode. For example, at least one pixel in every region (e.g., 10 mm×10 mm block) of a display may be placed in a sensing state during a complete cycle of a low-resolution scan mode. In some embodiments, pixels which are not in a sensing mode in a given timeslot may be in a display mode in that timeslot. For example, in a first timeslot, a first set of pixels may be in a sensing state and a second set of pixels may be in a display state. In a second time slot, the modes may be reversed such that second set of pixels is be in a sensing state and the first set of pixels is in a display state.

In step s704, the system may determine whether an object (e.g., a finger) is within a detectable range of one or more of the sensing pixels. For example, the system may collect measurements from each of the electrodes which are in a sensing state during a given time period. The system may then analyze whether any of the electrodes returns a measurement that indicates the presence of an object. In some embodiments, if a single electrode returns a positive measurement, the system may analyze neighboring pixels (such as other pixels in a cluster) to confirm the presence indication. In some embodiments, the system may store a position value indicating a location on a sensor grid at which a presence measurement was detected.

If no object is detected, the process may return to step s702 in which the system continues to perform low-resolution scans and await a positive presence detection. If the system detects an object that is near or touches one or more sensor pixels included in the system, the system may proceed to step s706, in which the system may perform a high-resolution scan. In some embodiments, the system may perform a high-resolution scan by sampling some or all of the pixels across the sensor grid. In other embodiments, a high-resolution scan may be localized around the location at which the presence measurement was detected in step s704. For example, upon detecting an object presence at a location the system may sample each of the electrodes, or a relatively high density of the electrodes as compared to the low-resolution scan mode, within a given radius of the location. In other embodiments, the system may sample each of the electrodes, or a relatively high density of the electrodes as compared to the low-resolution scan mode, within a sub-grid that encompasses or is centered about the location. The size of the region selected for the high-resolution scan may be large enough and with sufficient resolution to capture and analyze fingerprint image and permit an authentication procedure. For example, the region in which a high-resolution scan is performed may include at least 1,000, 5,000, 10,000, 20,000, 40,000 or 100,000 electrodes. In some embodiments, the region in which a high-resolution scan may be a 100×100, 200×200, 300×300, or 400×400 grid, or a circle with radius 50, 100, 200, 300, or 400 pixels.

By performing a high-resolution scan, more information regarding an object may obtained. For example, in case the system is configured to detect a fingerprint, when the system operates in the low-resolution scan mode, the presence and location of a finger may be determined. In some embodiments, the low-resolution scan may not have sufficient resolution to perform an authentication procedure using the results of the low-resolution scan. By operating the system in the high-resolution scan mode, the system may obtain sufficiently detailed information to determine the locations of ridges and valleys of a fingerprint, which may support an authentication procedure in which, for example, the resulting image may be compared to one or more template images associated with one or more registered users.

Figure 9A:
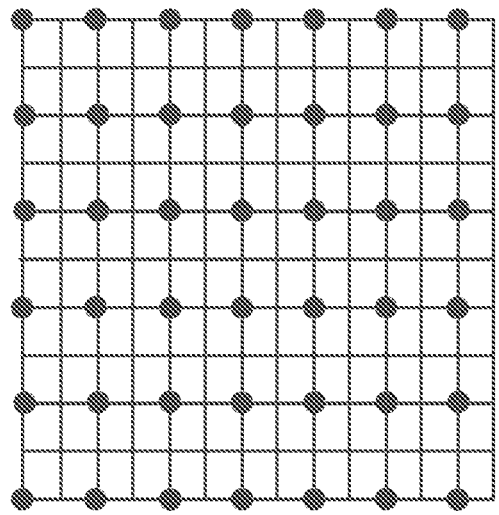
FIGS. 9A and 9B illustrate a configuration of sensor pixels used in exemplary high-resolution scan modes.
Figure 9B:
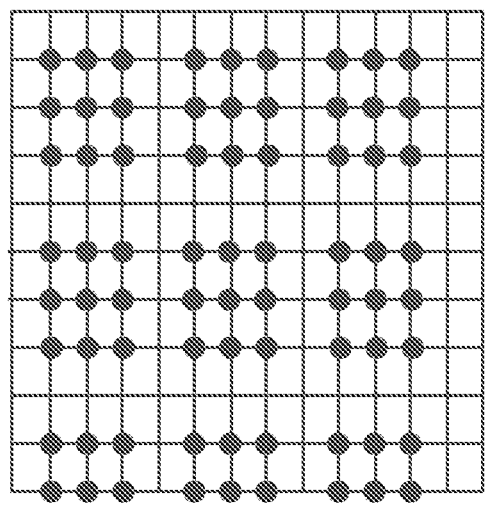

FIGS. 9A and 9B shows exemplary arrangements of sensor pixels which may be used for scanning in an exemplary high-resolution scan mode. For example, in FIG. 9A, every other sensor pixel is used for scanning (as compared to using every three sensor pixels for scanning, as shown in FIG. 8A). As another example, in the exemplary high-resolution scan mode shown in FIG. 9B, a group of sensor pixels arranged in a 3×3 matrix are used for scanning (as compared to using a group of sensor pixels arranged in a 2×2 matrix, as shown in FIG. 8B).

The configurations of sensor pixels used in the scan modes shown in FIGS. 8A-8B and 9A-9B are provided just for illustration purpose only and do not limit the embodiments of this disclosure in any way. For example, in the exemplary low-resolution scan mode shown in FIG. 8A, every five sensor pixels (rather than every three sensor pixels as shown in FIG. 8A) may be used for scanning. As another example, in the exemplary low-resolution scan mode shown in FIG. 8B, a group of sensor pixels arranged in a 2×1 matrix (rather than a group of sensor pixels arranged in a 2×2 matrix as shown in FIG. 8B) may be used for scanning.

Referring back to FIG. 7, after switching to operate in the high-resolution scan mode, in step s708, the system may obtain a high-resolution image of an object (e.g., a finger) and, optionally, perform an appropriate action based on the obtained high-resolution image. In case the system is used for detecting a fingerprint, in the step s708, the system may analyze the high-resolution data acquired in step s706. In some embodiments, this data may be analyzed to determine an identity of a user. For example, the system may compare captured image data to one or more stored images associated with one or more registered users to determine whether the captured image matches one or more of the stored images. In some embodiments, the system may return to the low resolution scan mode upon performing step s708. In some embodiments, the system may return to the low resolution scan mode upon completing a high-resolution scan in step s706.

NUMBERED EMBODIMENTS

The below-listed numbered embodiments are intended to provide exemplary ways the present disclosure may be implemented.

A1. A system for display and detecting the presence of a user's finger or other element, the system comprising:
   a display comprising:
      a display switch;
      a first display electrode; and
      a second display electrode;
      a light emission layer disposed between the first display electrode and the second display electrode, wherein the first display electrode and the second display electrode are configured to apply a voltage to the light emission layer when the first switch is in a closed state;
   an external surface, the external surface of the system being configured to transmit light emitted by the light emission layer toward a user; and
   a sensor comprising:
      a sensor switch;
      a sensor electrode; and
      an analog front end connected to the sensor electrode via the second switch, the sensor electrode being configured, when the switch is in a closed state, to receive and provide to the analog front end a signal indicative of the presence of the user's finger or other element.

A2. The system of embodiment A1, wherein:
one or more components of the sensor are nontransparent;
at least a portion of the first display electrode defines a light emission area;
a light emission path is defined between the light emission area and the external surface; and
at least 50% of the light emission path is unobstructed by the nontransparent sensor components.

A3. The system according to embodiment A2, wherein
the sensor is disposed between the external surface and the display, and
the sensor electrode is at least partially disposed within the light emission path.

A4. The system according to embodiment A3, wherein the one or more nontransparent sensor components are at least partially vertically aligned with one or more components of the display which do not emit light.

A5. The system according to embodiment A1, wherein:
the sensor electrode is disposed between the light emission layer and the external surface;
the light emission layer is disposed between the sensor electrode and the second switch; and
the sensor electrode is electrically connected to the second switch of the sensor through an opening in the light emission layer.

A6. The system according to embodiment A4, wherein the first switch of the display and the second switch of the sensor deposited on a common substrate.

A7. The system according to embodiment A1, wherein the first switch of the display and the second switch of the sensor are disposed between the first display electrode and the sensor electrode.

A8. The system according to embodiment A1, wherein the first and second switches are disposed between the light emission layer of the display and the external surface of the system.

A9. The system according to embodiment A1, wherein the light emission layer is disposed between (i) the first display electrode, and (ii) the first and second switches.

A10. The system according to embodiment A9, wherein the first display electrode is electrically connected to the first switch of the display through an opening in the light emission layer.

A11. The system according to embodiment A10, wherein the first display electrode and the sensor electrode are the same electrode.

A12. The system according to embodiment 1, wherein:
the sensor comprises a plurality of sensor electrodes;
the system is configured to: (i) detect the presence of a user's finger using a first set of sensor electrodes, and (ii) after detecting the presence of the user's finger using the first set of sensor electrodes, detect a fingerprint of the user's finger using a second set of sensor electrodes, and
a density of electrodes per unit area of the sensor system of the second set of electrodes is greater than the density of the first set of sensor electrodes.

B1. A method for detecting the presence of a user's finger or other element, the method being performed using a system comprising a plurality of sensor electrodes, the method comprising:
detecting the presence of a user's finger using a first set of sensor electrodes;
after detecting the presence of the user's finger using the first set of sensor electrodes, detecting a fingerprint of the user's finger using a second set of sensor electrodes;
wherein a density of electrodes per unit area of the sensor system of the second set of electrodes is greater than the density of the first set of sensor electrodes.

B2. The method of embodiment B1, wherein the step of detecting a fingerprint of the user's finger using a second set of sensor electrodes comprises performing a scan using the second set of electrodes in a region of the system in which the presence was detected.

B3. The method of any of embodiments B1-B2, wherein the step of detecting a user's finger using a first set of sensor electrodes comprises cycling a plurality of subsets of the first set of sensor electrodes through sensing states and non-sensing states over a plurality of timeslots.

B4. The method of embodiment B3, wherein the system comprises a display, and after each of the plurality of subsets of the first set of sensor electrodes has been cycled through its respective sensing state, at least one pixel in every 10 mm by 10 mm region of the display has been placed in a sensing state.

B5. The method of any of embodiments B1-B4, wherein each electrode of the first and second sets of electrodes has a sensing state and a non-sensing state and is configured to emit light in the non-sensing state.

B6. The method of any of embodiments B1-B5, further comprising storing in a memory of the system a position value indicating a location on a sensor grid at which the presence of the user's finger was detected.

While the subject matter of this disclosure has been described and shown in considerable detail with reference to certain illustrative embodiments, including various combinations and sub-combinations of features, those skilled in the art will readily appreciate other embodiments and variations and modifications thereof as encompassed within the scope of the present disclosure. Moreover, the descriptions of such embodiments, combinations, and sub-combinations is not intended to convey that the claimed subject matter requires features or combinations of features other than those expressly recited in the claims. Accordingly, the scope of this disclosure is intended to include all modifications and variations encompassed within the spirit and scope of the following appended claims.

The invention claimed is:

1. A display system for detecting the presence of a user's finger or other element, the system comprising:
a display comprising:
a first switch;
a first display electrode;
a second display electrode; and
a light emission layer disposed between the first display electrode and the second display electrode, wherein the first display electrode and the second display electrode are configured to apply a voltage to the light emission layer when the first switch is in a closed state;
an external surface being configured to transmit light emitted by the light emission layer toward a user; and
a sensor comprising:
a second switch;
a sensor electrode; and
an analog front end connected to the sensor electrode via the second switch, the sensor electrode being configured, when the second switch is in a closed state, to receive and provide to the analog front end a signal indicative of the presence of the user's finger or other element, wherein the sensor electrode overlaps the first display electrode and/or the second display electrode at least partially, wherein the sensor electrode is disposed between the light emission layer and the external surface;

the light emission layer is disposed between the sensor electrode and the second switch; and the sensor electrode is electrically connected to the second switch of the sensor through an opening in the light emission layer.

2. The system of claim 1, wherein:

one or more components of the sensor are nontransparent;

at least a portion of the first display electrode defines a light emission area;

a light emission path is defined between the light emission area and the external surface; and at least 50% of the light emission path is unobstructed by the nontransparent sensor components.

3. The system according to claim 2, wherein the sensor is disposed between the external surface and the display, and the sensor electrode is at least partially disposed within the light emission path.

4. The system according to claim 3, wherein the one or more nontransparent sensor components are at least partially vertically aligned with one or more components of the display which do not emit light.

5. The system according to claim 4, wherein the first switch of the display and the second switch of the sensor deposited on a common substrate.

6. The system according to claim 1, wherein:

the sensor comprises a plurality of sensor electrodes;

the system is configured to: (i) detect the presence of a user's finger using a first set of sensor electrodes, and (ii) after detecting the presence of the user's finger using the first set of sensor electrodes, detect a fingerprint of the user's finger using a second set of sensor electrodes, and a density of electrodes per unit area of the sensor system of the second set of electrodes is greater than the density of the first set of sensor electrodes.

* * * * *